(12) United States Patent
D'Heureuse et al.

(10) Patent No.: US 6,318,264 B1
(45) Date of Patent: Nov. 20, 2001

(54) PRINTING MACHINE AND PRINTING PROCESS

(75) Inventors: Walter D'Heureuse, Ladenburg; Helmut Kipphan, Schwetzingen; Martin Schmitt-Lewen, Bammental, all of (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

(21) Appl. No.: 09/333,150

(22) Filed: Jun. 14, 1999

(30) Foreign Application Priority Data

Jun. 12, 1998 (DE) .............................. 198 26 377

(51) Int. Cl.$^7$ .............................. B41N 1/08; B41C 1/10; B41L 25/00

(52) U.S. Cl. .......................... 101/467; 101/147; 101/148; 101/453; 101/465; 101/466; 101/478; 101/456

(58) Field of Search ................... 101/453, 454, 101/456, 465–467, 478, 148, 147, 450.1

(56) References Cited

U.S. PATENT DOCUMENTS

| | | | |
|---|---|---|---|
| 2,002,815 | * 5/1935 | Harrold | 101/147 |
| 3,072,049 | * 1/1963 | Huebner | 101/147 |
| 5,074,213 | * 12/1991 | Kurosawa | 101/487 |
| 5,540,145 | * 7/1996 | Keller | 101/148 |
| 5,743,188 | * 4/1998 | Ghosh et al. | 101/467 |
| 5,836,249 | * 11/1998 | Chatterjee et al. | 101/467 |
| 5,925,496 | * 7/1999 | Ghosh et al. | 101/467 |
| 6,048,654 | * 4/2000 | Nakayama et al. | 101/467 |
| 6,079,331 | * 6/2000 | Koguchi et al. | 101/467 |
| 6,082,263 | * 7/2000 | Koguchi et al. | 101/456 |
| 6,087,072 | * 7/2000 | Sasaki et al. | 101/453 |
| 6,125,755 | * 10/2000 | Link et al. | 101/147 |

FOREIGN PATENT DOCUMENTS

| | | |
|---|---|---|
| 0 903 223 A1 | 3/1999 | (EP) . |
| 0 911 154 A1 | 4/1999 | (EP) . |
| 0 911 155 A1 | 4/1999 | (EP) . |

OTHER PUBLICATIONS

Rong Wang et al., "Light–induced amphiphilic surfaces", *Nature* Jul. 31, 1997, pp. 431–432.

Japanese Patent Abstracts No. 10250027 (Yasuyuki), dated Sep. 22, 1998.

* cited by examiner

*Primary Examiner*—Stephen R. Funk
(74) *Attorney, Agent, or Firm*—Herbert L. Lerner; Laurence A. Greenberg; Werner H. Stemer

(57) ABSTRACT

A printing machine includes a printing form, an optical imaging unit for directly imaging the printing form, and an inking unit for inking the printing form, the printing form having a surface formed of a material with wetting properties reversibly changeable between a state with a very small contact angle and a state with a relatively large contact angle, the state with a small contact angle being achievable by action of light having a wavelength shorter than a material-specific wavelength, and a cleaning device for cleaning the surface of the printing form; and a printing process performed with the printing machine.

10 Claims, 2 Drawing Sheets

PRINTING MACHINE AND PRINTING PROCESS

BACKGROUND OF THE INVENTION

Field of the Invention

The invention relates to a printing machine and an appertaining printing process. In offset printing, ever-greater parts of the operations for producing the printing form, the so-called pre-press stage, are performed with the assistance of electronic data processing. In the so-called computer-to-plate technique, all the operations from the production of the page layout to the digitally controlled imaging of the printing plate occur in the computer. The imaging of the printing plates takes place separately in a special exposure unit. In the so-called computer-to-press/direct imaging technique, as has been applied for the first time by Heidelberger Druckmaschinen AG in the GTO-DI, the exposure unit is transferred into the printing machine. The plates are exposed on the cylinder directly in the printing machine.

With regard to digital printing, techniques which go even further, also referred to as computer-to-print and computer-to-paper, include transferring digitized data from a computer to paper or other printing materials without a printing form with a fixed image via an intermediate carrier (e.g. photoconductor) or without any material intermediate stage. Corresponding printing techniques are, for example, electrophotography, thermal transfer printing or ink-jet printing and allow the motif to be changed during continuous printing, for example to produce a new printed image with each revolution of a form cylinder. In this regard, the production of a printing form is dispensed with, because each individual printing image is newly provided. However, this sacrifices the advantage of conventional processes such as offset printing, for example, of being able to print with high productivity from a constant printing form and of ensuring very high quality over the print run or edition.

SUMMARY OF THE INVENTION

It is accordingly an object of the invention to provide a printing machine and an appertaining printing process with which it is possible both to print continuously from a master, such as is performed in offset printing, and also to change the motif during continuous printing, such as is possible, for example, in the case of electrophotography.

In accordance with the foregoing object of the invention, starting from a printing machine for the computer-to-press/direct imaging technique, there is consequently provided, in accordance with one aspect of the invention, a printing machine comprising a printing form, an optical imaging unit for directly imaging the printing form, and an inking unit for inking the printing form, the printing form having a surface for med of a material with wetting properties reversibly changeable between a state with a very small contact angle and a state with a relatively large contact angle, the state with a small contact angle being achievable by action of light having a wavelength shorter than a material-specific wavelength, and a cleaning device for cleaning the surface of the printing form.

In accordance with another feature of the invention, the material forming the surface contains $TiO_2$.

In accordance with a further feature of the invention, the printing form is selected from the group consisting of a form cylinder, a plate, and a strip.

In accordance with an added feature of the invention, the imaging unit is an area exposure unit for uniformly exposing the printing form to light having the wavelength shorter than the material-specific wavelength and for removing a molecular water layer on the printing form by light having a wavelength longer than the material-specific wavelength, as well as of suitable intensity and duration of action.

In accordance with an additional feature of the invention, the imaging unit is constructed for emitting light having a wavelength shorter than the material-specific wavelength.

In accordance with yet another feature of the invention, the light emitted by the imaging unit represents a negative image of the printing image.

In accordance with yet a further feature of the invention, the light emitted by the imaging unit represents a positive image of the printing image.

In accordance with yet an added feature of the invention, ink for inking the printing form by the inking unit is an ink selected from the group consisting of offset ink and offset-like ink.

In accordance with yet an additional feature of the invention, the printing machine of the invention includes a dampening unit for dampening the printing form.

In accordance with a second aspect of the invention, there is provided a printing process having the following process steps:

a) exposing a printing form having a surface formed of a material with wetting properties reversibly changeable between a state having a very small contact angle and a state having a relatively large contact angle, over at least a select area of the surface, to light having a wavelength shorter than a material-specific wavelength, so as to bring at least the select area of the surface into the state with the very small contact angle;

b) inking the printing form so that printing ink is accepted in image regions of the printing form;

c) transferring the printing ink from the printing form to printing material;

d) repeating processing steps b) and c) as required; and g) cleaning the printing form.

In accordance with a third aspect of the invention, there is provided a printing process having the following successive process steps:

a) exposing a printing form having a surface formed of a material with wetting properties reversibly changeable between a state having a very small contact angle and a state having a relatively large contact angle, over the whole area of the surface, to light having a wavelength shorter than a material-specific wavelength, so as to bring the whole area of the surface into the state with the very small contact angle;

b) allowing a molecular water layer to form on the printing form;

c) irradiating image regions of the printing form with light having a wavelength longer than the material-specific wavelength, so as to remove the molecular water layer from image regions in the printing form;

d) inking the printing form so that printing ink is accepted in the image regions of the printing form;

e) transferring the printing ink from the printing form to printing material;

f) repeating processing steps d) and e) as required; and g) cleaning the printing form.

In accordance with a fourth aspect of the invention, there is provided a printing process having the following successive process steps:

a) exposing a printing form having a surface formed of a material with wetting properties reversibly changeable between a state having a very small contact angle and a state having a relatively large contact angle, in non-image regions of the surface, to light having a wavelength shorter than a material-specific wavelength, so as to bring the non-image regions into the state with the very small contact angle;

b) allowing a molecular water layer to form on the printing form;

c) inking the printing form so that printing ink is accepted in the image regions of the printing form;

d) transferring the printing ink from the printing form to printing material;

e) repeating process steps c) and d) as required; and f) cleaning the printing form.

In accordance with a fifth aspect of the invention, there is provided a printing process having the following successive process steps:

a) exposing a printing form having a surface formed of a material with wetting properties reversibly changeable between a state having a very small contact angle and a state having a relatively large contact angle, in image regions of the surface, to light having a wavelength shorter than the material-specific wavelength, so as to bring the image regions into the state with the very small contact angle;

b) inking the printing form so that printing ink is accepted in the image regions of the printing form;

c) transferring the printing ink from the printing form to printing material;

d) repeating process steps b) and c) as required; and e) cleaning the printing form.

In accordance with a sixth aspect of the invention, there is provided a printing process having the following successive process steps:

a) exposing a printing form having a surface formed of a material with wetting properties reversibly changeable between a state having a very small contact angle and a state having a relatively large contact angle, in image regions of the surface, to light having a wavelength shorter than the material-specific wavelength, so as to bring the image regions into the state with the very small contact angle;

b) allowing a molecular water layer to form on the printing form;

c) dampening the entire surface of the printing form with a dampening unit so that additional water is unable to be accepted in the image regions, and a water film of macroscopic thickness is formed in non-image regions on the printing form;

d) inking the printing form so that printing ink is accepted in the image regions of the printing form;

e) transferring the printing ink from the printing form to printing material;

f) repeating process steps d) and e) as required; and g) cleaning the printing form.

In accordance with a seventh aspect of the invention, there is provided a printing process having the following successive process steps:

a) exposing a printing form having a surface formed of a material with wetting properties reversibly changeable between a state having a very small contact angle and a state having a relatively large contact angle over the entire area of the surface, to light having a wavelength shorter than a materialspecific wavelength, so as to bring the entire area of the surface into the state with the very small contact angle;

b) irradiating image regions of the printing form with light having a wavelength longer than the material-specific wavelength, as to bring the image regions into the state with the relatively large contact angle;

c) allowing a molecular water layer to form on the printing form in non-image regions thereof;

d) inking the printing form so that printing ink is accepted in the image regions;

e) transferring the printing ink from the printing form to printing material;

f) repeating process steps d) and e) as required; and g) cleaning the printing form.

In accordance with another mode of the process according to the invention, the transfer of the printing ink is directly from the printing form to the printing material.

In accordance with a further mode of the process according to the invention, the transfer of the printing ink from the printing from to the printing material is via an intermediate carrier.

In accordance with a concomitant mode, the process of the invention includes selectively performing the printing continuously with a motif identical from print to print, and in a variable manner with a motif differing from print to print.

The angle of contact is defined as the angle which is formed between the surface of a liquid adjoining the printing-form surface and the printing-form surface per se, and is a measure of the surface tension between the printing-form surface and the liquid.

A material having the aforementioned properties exists, for example in the form of $TiO_2$, cf. the journal Nature, Vol. 388, Jul. 31, 1997, p. 431. $TiO_2$ surfaces become amphiphilic under ultraviolet radiation, that is to say both hydrophilic and oleophilic. In particular, for example, the angle of contact of water on the surface changes from 72° normally to substantially 0° when exposed; the changed surface property is reversible. This material or a material having similar properties is used to coat the printing form, which is often a form cylinder but may also be a printing plate.

The arrangement and function of the components of such a printing machine depend upon which of several alternative printing processes is used.

In order to perform the first process according to the invention, the imaging unit is preceded by an area exposure unit, in order to irradiate the printing form uniformly over the entire area with light having a wavelength shorter than the material-specific wavelength. A coherent molecular water layer subsequently forms on the printing form, and this layer does not permit the acceptance of ink. The imaging unit emits light with a longer wavelength than the material-specific wavelength, the intensity and duration of action of that light being so great that the molecular water layer on the printing form is removed in image regions. The image regions accept the printing ink, which is subsequently transferred to the printing material. The processes of inking and transferring can be repeated as desired, without re-imaging, because the printing image is self-maintaining. For a change of the printing motif, the printing form is cleaned and the processes can start again.

The water for forming the molecular water layer on the printing form can either be taken up from the surrounding air, or the formation of the molecular water layer is assisted actively by the printing form having water vapor or damp air applied thereto.

The molecular water layer which is produced following exposure to light having a wavelength shorter than the materialspecific wavelength, and which is ultraviolet light in the case of $TiO_2$, will not in practice be absolutely uniform. A molecular water layer is understood here to be a regular or irregular distribution of water molecules having an average thickness between one atomic layer and several atomic layers on the surface. Thus, a water layer is in any case significantly thinner than a water film, such as is used in conventional offset printing.

The particular properties of such a water layer essentially are that the molecular water layer has a tendency not to take up any further water, as opposed to a macroscopic water film, such as is applied, for example, by a dampening unit of a printing machine to a printing form. In addition, the molecular water layer is more or less oleophobic, that is to say ink-repellent in the case of an oil-based ink.

The imaging unit may be, for example, a controllable infrared laser with a beam deflection unit or an LED row of infrared light-emitting diodes, which write on the printing form pixel by pixel or line by line. Imaging units of this type exist, for example for electrophotographic printers.

In the second process according to the invention, it is not necessary to remove the water layer partially. Instead, use is made of an imaging unit which irradiates the surface, which is initially in the state with a relatively large angle of contact, in the image regions, using light having a wavelength shorter than the material-specific wavelength. Water is deposited on the exposed locations, and the unexposed locations accept ink.

In order to perform the second process, an ultraviolet imaging unit would be needed in the case of a $TiO_2$ surface. Laser imaging units for ultraviolet light are very expensive, and appropriate mass-production LED imaging units are at present not yet available. However, it is possible, for example, to use a conventional UV source which produces a focused beam that is deflected and modulated like a laser beam in order to write an image onto the printing form. Further possibilities are to irradiate the printing form through a mask using ultraviolet light, or to use an array of switchable mirrors.

Whereas, in the second process, a negative image of the printing image is produced on the printing form, in the third process according to the invention, it is a positive image. In the latter case, care must be taken that the exposed image regions cannot take up any water before the printing ink is applied. The exposed locations accept ink, while the unexposed locations are ink-repellent.

In the second process, it is necessary for the molecular water layer to repel the printing ink to a sufficient extent, which can depend, inter alia, on the thickness of the molecular water layer as the type of printing ink. In cases wherein the molecular water layer does not repel the printing ink to a sufficient extent, recourse may be had to the fourth process according to the invention. In the latter case, following the formation of the molecular water layer on the image regions, the entire surface of the printing form is dampened by a dampening unit. In the image regions, no additional water is accepted by the printing form, and in the non-image regions, a conventional water film with a macroscopic thickness is formed on the printing form.

Depending upon the specific condition of the surface of the printing form, and upon the printing process used, the printing ink may possibly be a conventional or a suitably modified offset ink.

Currently used offset inks for waterless offset printing contain silicone oil. When ink is applied to the silicone surface of the printing form, a fine silicone oil film is formed, which prevents the acceptance of ink in the print-free regions. In an analogous manner, a water-based ink can be developed which, together with the molecular water layer on the printing form, likewise exhibits a repellent action. Therefore, the printing inks which are considered for the invention are not restricted to oil-based inks.

As mentioned, in the printing machine and the printing process of the invention, the printing image is self-maintaining, because of the special properties of the surface of the printing form. It is therefore not necessary for the printing image to be reapplied for each individual printing operation. After the desired number of prints has been produced, the cylinder surface can be cleaned with a suitable cleaning agent. In order to perform the processes two, three and four, a cleaning agent which reproduces the state with a relatively large angle of contact in a chemical and/or physical way may be advantageous. In the first process, this is not necessary, because the surface is made completely amphiphilic by the area exposure unit before a new printing image is written.

The aforementioned $TiO_2$ surfaces were developed with a view to preventing window panes from becoming dirty and to achieving the self-cleaning of surfaces in outdoor areas. Long service times are advantageous for these applications. However, for the invention it is advantageous if the printing image can be changed as quickly as possible, right down to the case in which, for example, a new printing image can be written for each revolution of a form cylinder.

If, therefore, in the cases of processes two, three and four, it is not possible to reform the amphiphilic property of the printing-form surface, in a deliberate way, for example with the aid of the cleaning device, or if this is associated with a high outlay, it is better for the persistence time to be short, in order that the amphiphilic property of the printing-form surface can automatically decay rapidly and a new printing image can be written immediately. In the case of a $TiO_2$ surface, this may possibly be achieved by changing the chemical composition or by physical structure changes, or further materials are found which have similar properties or properties which are even more beneficial for the application in printing machines.

If the persistence time of the amphiphilic property of the printing-form surface can be reduced down to approximately 0.1 to 1 second, it is possible for a new printing image to be written, for example, at each revolution of a form cylinder. Because, in this case, the printing image is maintained for only a very short time, it would have to be renewed continuously not only in the case of printing an individual motif but also in the case of printing-run or edition printing. In accordance with the invention, the advantages of the offset printing remain.

The optimum persistence time depends upon the respective application of the printing machine. Depending upon the extent to which printing-run or edition printing and the extent to which individual motif printing is desired, a compromise will possibly be adopted.

The desired properties of the printing-form surface may be achieved during manufacture, or optimized for the application at hand, by suitable selection of the crystalline form of the surface material and, if appropriate, by the addition of further materials, such as doping with suitable foreign atoms. Materials other than titanium oxide are also considered as a base material, for example hafnium oxide or oxide of other elements from the fourth auxiliary group (titanium Group) of the Periodic Table of the Elements.

The atomic processes during the light-induced formation of the amphiphilic property of the material of the printing-form surface permit the inference that it is possible to find a material or material mixture which is suitable for the application at hand and which not only can be made amphiphilic by appropriate exposure but of which the amphiphilic property can be deliberately reformed again to be hydrophobic and oleophobic. In the case of titanium oxide, the activation threshold must be overcome, above which the oxygen vacancies produced during the UV exposure are reoccupied from the available oxygen. In order to overcome the activation threshold, the surface of the printing form could be exposed to a further radiation source which, for example, emits sufficiently intensive infrared light. Otherwise, exposure of the entire area of the printing form to such a radiation source, for example in the cleaning device, could be utilized to displace the entire area of the printing form into the non-amphiphilic state before re-imaging.

A material having the aforedescribed properties makes a fifth process according to the invention possible, in which the printing-form surface is first exposed to a UV area exposure unit and is subsequently irradiated in image regions using an imaging unit which radiates, for example, in the visible or infrared region, in order to enhance the amphiphilic property in the image regions. Water is deposited at the amphiphilic locations, the non-image regions, and ink is subsequently deposited on the printing form in the image regions. This process needs a printing ink which adheres to a sufficient extent to the non-amphiphilic locations. This can be achieved, if appropriate, by the fact that the amphiphilic property is not being reduced completely but only to a certain level by suitable irradiation in the image regions.

With the invention, the printing ink can be transferred from the printing form to a printing material via an intermediate carrier, for example, via a blanket cylinder as in the case of conventional offset printing. In this case, if the printing motif is changed, not only the printing form but also the intermediate carrier must be cleaned. The cleaning of an intermediate carrier is dispensed with if the printing ink is transferred directly from the printing form to a printing material, in a manner similar to that in gravure printing.

As mentioned, the invention makes it possible to print both continuously from one master, the motif remaining the same from print to print, and also in a variable manner, the motif being changed from print to print, and it is possible at any time to change from one of these processes to the other.

Other features which are considered as characteristic for the invention are set forth in the appended claims.

Although the invention is illustrated and described herein as embodied in a printing machine and a printing process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
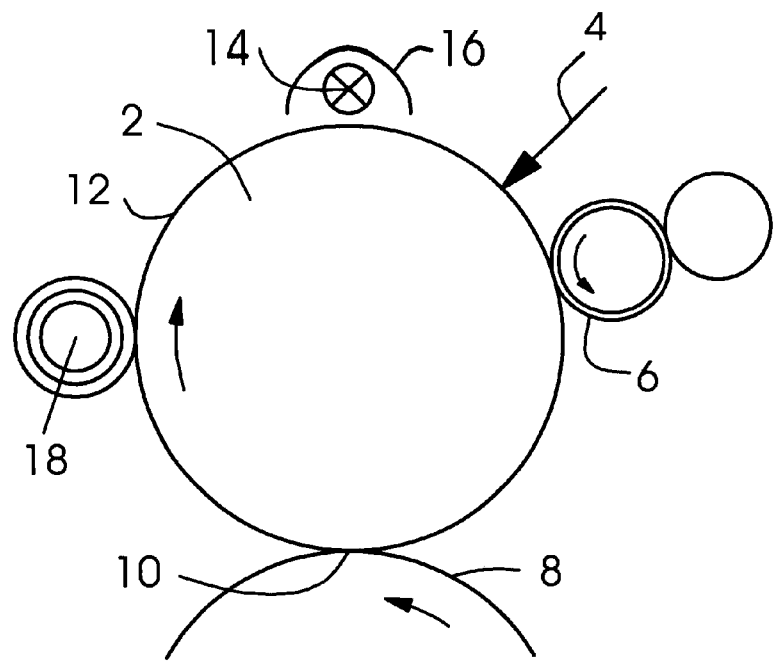
FIG. 1 is a highly diagrammatic side elevational view of a printing machine with a rewritable form cylinder for performing a first printing process according to the invention.

Referring now to all of the figures of the drawings, identical or functionally identical components are designated by identical reference numerals.

The printing machine shown diagrammatically in FIG. 1 includes a form cylinder 2 having a surface 12 of a material which has the property of being able to assume two different states, a first state in which a liquid adjoining the surface 12 forms a relatively large angle of contact, for example 72° for water, and a second state with a very small angle of contact of nearly 0°. Such a surface 12 is formed, for example, of a ceramic made of titanium oxide ($TiO_2$) or of modified titanium oxide. The first state is established automatically over time if the surface 12 is located in a dark and dry environment and, starting from this state, the second state is reached as a result of the action of ultraviolet radiation. In the second state, the surface 12 is extremely amphiphilic, that is to say both hydrophilic and oleophilic. Water or oil which comes into contact therewith spreads out to form an extremely thin film.

Arranged one after another at the circumference of the form cylinder 2 are a UV area exposure station, an IR imaging station, an inking unit, a transfer station and a cleaning station.

The IR imaging station contains an IR imaging unit 4 (illustrated diagrammatically), which is, for example, a controllable infrared laser with a beam deflection unit or an LED row with infrared light-emitting diodes, in order to expose the form cylinder 2 pixel by pixel in accordance with a printing image from digital databases.

The inking unit contains an inking roller 6, which rolls on the surface 12 of the form cylinder 2 and, via further rollers and ink supplies (not shown), is supplied uniformly with printing ink in order to ink the form cylinder 2 in accordance with the printing image.

The transfer station contains a cylinder 8 in the form of a blanket cylinder or any other intermediate carrier, to which the printing image formed of printing ink on the form cylinder 2 is transferred at a linear contact location 10 between the form cylinder 2 and the cylinder 8. At a different nonillustrated location on the circumference of the cylinder 8, the printing image is further transferred to a printing material, for example in a manner which is known from offset printing. Alternatively, the printing material can be led between the form cylinder 2 and the cylinder 8, that is to say it can be printed directly as in gravure printing, for example. In this case, the cylinder 8 represents an impression cylinder.

The cleaning station contains a diagrammatically illustrated cleaning device 18, which can optionally be activated in order to clean the surface 12 of the form cylinder 2 from any remaining printing ink.

The UV area exposure unit contains an ultraviolet lamp 14 with a reflector 16, in order to irradiate the surface 12 of the form cylinder 2 uniformly with UV light. In addition, the reflector 16 may delimit a more-or-less closed space above the surface 12 of the form cylinder 2, to which space water vapor or air containing water vapor is fed, to which the surface 12 of the form cylinder 2 is exposed when it passes the UV area exposure unit.

The printing machine shown in FIG. 1 operates as follows. The form cylinder 2, the inking roller 6 and the cylinder 8 rotate in the directions shown by the arrows. The surface 12 of the form cylinder 2 which is irradiated with UV light from an ultraviolet lamp 14 becomes extremely water-attracting. In the presence of water, a molecular water layer is produced, a very thin, uniform water film which is considerably thinner than that in conventional offset printing. Given sufficient humidity in the surrounding air, this water film can be formed on the path of the surface 12 from the area exposure unit to the IR imaging unit 4. Otherwise, the formation of the molecular water layer can be promoted by the aforementioned supply of water vapor or air containing water vapor, for example in the region of the ultraviolet lamp 14 or at any other location on the path of the surface 12 from the UV area exposure unit to the IR imaging unit 4.

Through the intermediary of the IR imaging unit 4, the molecular water layer in the image regions determined by the digital data is removed or, as expressed in simple terms, is evaporated, so that the surface 12 of the form cylinder 2 becomes sufficiently water-free in these regions. The IR imaging unit 4 is arranged as close as possible to the inking roller 6, in order that the printing ink is applied to the form cylinder 2 before water from the surrounding air can be deposited thereon. If necessary, the assembly formed of the IR imaging unit 4 and the inking roller 6 may be shielded from the surrounding air by a common housing in which there is dry air and a slight positive pressure.

Because the exposed surface regions of the form cylinder 2 are ink-accepting whereas those regions covered by a molecular water layer are ink-repellent, the inking roller 6 transfers ink to the form cylinder 2 only in the IR-exposed regions, and a printing image of printing ink is thus formed on the form cylinder.

During the transfer of ink to the cylinder 8 or directly, for example, to paper, the ink splits, as is known from offset printing. As a result, residual ink remains on the surface 12 of the form cylinder 2 in accordance with the image. When the surface 12 of the form cylinder 2 passes the inking roller 6 on the next occasion, the ink is therefore supplemented without previously having to be re-imaged. It is thus possible for a large number of printing operations to be performed rapidly one after another. During these printing operations, the UV area exposure unit can remain switched off.

If the printing image is to be changed, the cleaning device 18 becomes actionable in order to clean the surface 12 of the form cylinder 2 of residual ink. The cleaned surface 12 is made completely amphiphilic again by the light from the ultraviolet lamp 14. After taking up a coherent molecular water layer, the surface 12 is exposed by the IR imaging unit 4 in accordance with the next printing image and is correspondingly inked, so that the next continuous printing can be performed.

Figure 2:
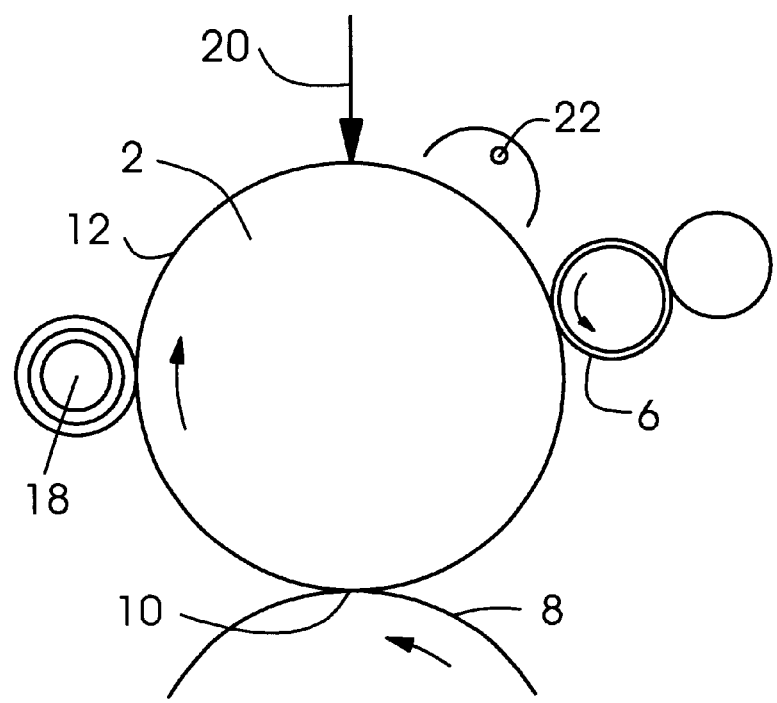
FIG. 2 is a view similar to that of FIG. 1 of a printing machine with a rewritable form cylinder for performing a second printing process according to the invention.

The printing machine shown in FIG. 2 is the same as that of FIG. 1, except for changes which include dispensing with the ultraviolet lamp 14 and replacing the IR imaging unit 4 by a UV imaging unit 20, which performs the same functions as the IR imaging unit 4 of FIG. 1, but operates with ultraviolet instead of infrared light.

In order to print with the printing machine shown in FIG. 2, the form cylinder 2 is UV-exposed negatively (that is to say in non-imaged regions) in accordance with an image. Water is deposited at the exposed locations, the water originating from the surrounding air or being fed to the form cylinder 2 at a damp air station 22. The unexposed locations are inked by the inking roller 6. The further course of the printing takes place as described in conjunction with FIG. 1.

During a change in the printing image, the residual ink is removed from the surface 12 of the form cylinder 2 by the cleaning device 18. If it is not possible to wait until the state of the surface 12 with a relatively large angle of contact is automatically established again, the cleaning device 18 can additionally act chemically and/or physically on the surface 12 in such a way that the return to the original state is accelerated. Alternatively, care can be taken from the start to ensure that the amphiphilic property of the surface 12 of the form cylinder 2 has a short persistence time or duration, for example 0.1 to 1 second, during which the amphiphilic property automatically disappears precisely during one revolution of the Form cylinder 2, so that it can be rewritten or newly written on directly. In each case, the surface 12 of the form cylinder 2 must be completely dry before it can be rewritten.

Figure 3:
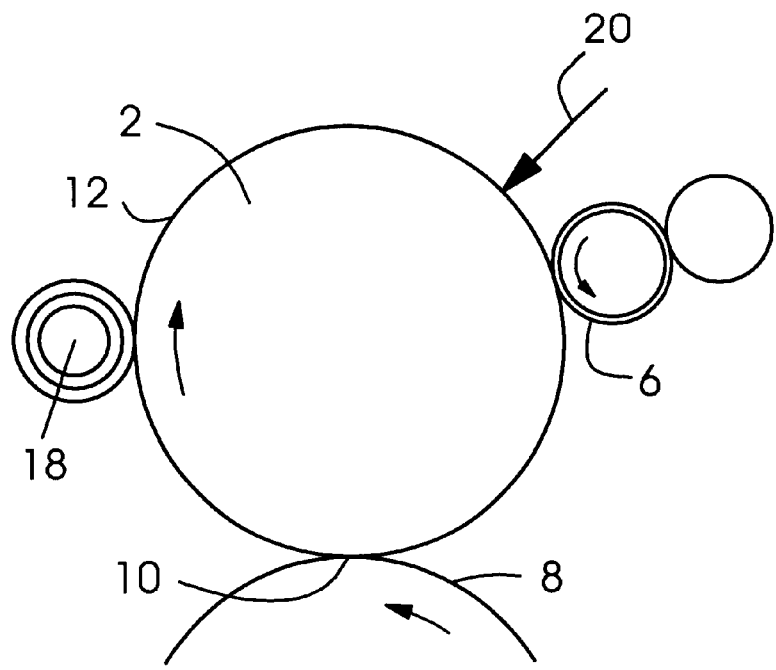
FIG. 3 is a view similar to that of FIG. 1, for example, of a printing machine with a rewritable form cylinder for performing a third printing process according to the invention.

The printing machine shown in FIG. 3 is the same as that of FIG. 2, except that the damp air station 22 is omitted, and the UV imaging region 20 is arranged as close as possible upline of the inking unit, as in FIG. 1.

In order to print with the printing machine shown in FIG. 3, the form cylinder 2 is UV-exposed positively (that is to say in image regions) in accordance with an image. The exposed locations are inked before water from the surrounding air can be deposited thereon. If necessary, the subassembly including the UV imaging units 20 and the inking roller 6 may be shielded from the surrounding air. Continuous printing and motif changing are performed as described hereinbefore in conjunction with FIG. 2.

Figure 4:
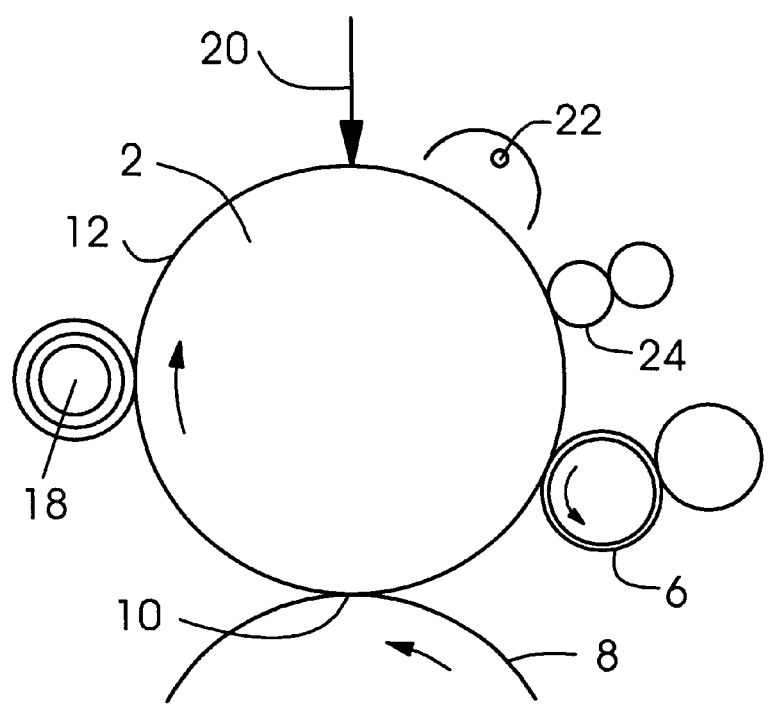
FIG. 4 is a view similar to that of FIG. 1, for example, of a printing machine with a rewritable form cylinder for performing a fourth printing process according to the invention.

The printing machine shown in FIG. 4 is the same as that of FIG. 2, apart from the fact that a conventional dampening unit having at least one dampening roller 24 adjoins the form cylinder 2, between the UV imaging units 20 (or the damp air station 22, if present) and the inking roller 6.

In order to print with the printing machine shown in FIG. 4, the form cylinder 2 is UV-exposed positively (that is say in image regions) in accordance with an image. Water from the surrounding air or from the damp air station 22 is deposited at the exposed locations. During the dampening of the surface 12 of the form cylinder 2 by the dampening roller 24, the molecular water layer in the image regions does not accept any additional water. In the non-image regions, however, respectively, a water film with a greater thickness is formed on the form cylinder 2 and repels 100% of the printing ink. The molecular water layer in the image regions accepts sufficient printing ink, given a suitable selection of parameters. Continuous printing and motif changing are performed as described hereinbefore in conjunction with FIG. 2.

In a further exemplary embodiment not illustrated in the figures, an UV area exposure unit and an imaging unit emitting both light with a longer wavelength and UV light are arranged at the circumference of the form cylinder. The form cylinder is made amphiphilic over the entire area, using the UV area exposure unit, and the surface material of the form cylinder is selected so that the imaging unit can at least partially enhance the amphiphilic property in the image regions again. At the amphiphilic locations, in the presence of water, small water islets of molecular thickness are produced, and do not accept any ink during the subsequent application of ink, while sufficient ink for the subsequent transfer of ink to paper or an intermediate carrier is deposited in the image regions.

We claim:

1. A printing machine comprising a printing form, an optical imaging unit for directly imaging the printing form, an inking unit for inking the printing form, said printing form having a surface formed of a material containing $TiO_2$, the $TiO_2$ having wetting properties reversibly changeable between a state with a very small contact angle with water and a state with a relatively large contact angle with water, said state with a small contact angle with water being achievable by action of light having a wavelength shorter than a material-specific wavelength, and a cleaning device for cleaning said surface of said printing form.

2. The printing machine according to claim 1, wherein said printing form is selected from the group consisting of a form cylinder, a plate, and a strip.

3. The printing machine according to claim 1, wherein said imaging unit is constructed for emitting light having a wavelength shorter than the material-specific wavelength.

4. The printing machine according to claim 3, wherein the light emitted by said imaging unit represents a negative image of a printing image.

5. The printing machine according to claim 1, wherein ink for inking said printing form by said inking unit is offset ink.

6. A printing process having the following process steps:

a) exposing a printing form having a surface formed of a material containing $TiO_2$, the $TiO_2$ having wetting properties reversibly changeable between a state having a very small contact angle with water and a state having a relatively large contact angle with water, over at least a select area of the surface, to light having a wavelength shorter than a material-specific wavelength, so as to bring at least the select area of the surface into the state with the very small contact angle with water, the areas of the surface not exposed by light having a wavelength shorter than a material-specific wavelength forming image regions;

b) inking the printing form so that printing ink is accepted in said image regions of the printing form;

c) transferring the printing ink from the printing form to printing material;

d) repeating processing steps b) and c) as required; and e) cleaning the printing form.

7. The process according to claim 6, wherein the transfer of the printing ink is directly from the printing form to the printing material.

8. The process according to claim 6, wherein the transfer of the printing ink from the printing form to the printing material is via an intermediate carrier.

9. The process according to claim 6, which includes selectively performing the printing continuously with a motif identical from print to print, and in a variable manner with a motif differing from print to print.

10. A printing process having the following successive process steps:

a) exposing a printing form having a surface formed of a material containing $TiO_2$, the $TiO_2$ having wetting properties reversibly changeable between a state having a very small contact angle with water and a state having a relatively large contact angle with water, in non-image regions of the surface, to light having a wavelength shorter than a material-specific wavelength, so as to bring the non-image regions into the state with the very small contact angle with water;

b) allowing a molecular water layer to form on the printing form;

c) inking the printing form so that printing ink is accepted in the image regions of the printing form;

d) transferring the printing ink from the printing form to printing material;

e) repeating process steps c) and d) as required; and f) cleaning the printing form.

* * * * *